United States Patent
Kitamura (10) Patent No.: US 7,842,190 B2
(45) Date of Patent: Nov. 30, 2010

(54) PLASMA ETCHING METHOD

(75) Inventor: Akinori Kitamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 216 days.

(21) Appl. No.: 11/691,804

(22) Filed: Mar. 27, 2007

(65) Prior Publication Data

US 2007/0228006 A1   Oct. 4, 2007

Related U.S. Application Data

(60) Provisional application No. 60/864,416, filed on Nov. 6, 2006, provisional application No. 60/792,959, filed on Apr. 19, 2006.

(30) Foreign Application Priority Data

Mar. 28, 2006   (JP)   ............................. 2006-088623
Sep. 29, 2006   (JP)   ............................. 2006-267916

(51) Int. Cl.
   *C03C 15/00* (2006.01)
(52) U.S. Cl. .............................. 216/67; 216/71; 216/72; 438/736
(58) Field of Classification Search .................. 216/67, 216/71, 72; 438/736
   See application file for complete search history.

(56) References Cited

U.S. PATENT DOCUMENTS

| | | | | |
|---|---|---|---|---|
| 5,631,197 | A  * | 5/1997 | Yu et al. ...................... | 438/699 |
| 6,326,302 | B1 * | 12/2001 | Joubert et al. ................ | 438/638 |
| 2001/0005632 | A1 * | 6/2001 | Seta et al. ................... | 438/689 |
| 2002/0173160 | A1 * | 11/2002 | Keil et al. ................... | 438/717 |
| 2003/0013316 | A1 * | 1/2003 | Kim et al. .................... | 438/737 |
| 2003/0045101 | A1 * | 3/2003 | Flanner et al. ............... | 438/689 |
| 2005/0079717 | A1 * | 4/2005 | Savas et al. .................. | 438/689 |
| 2005/0277254 | A1 * | 12/2005 | Ha et al. ..................... | 438/259 |
| 2006/0040502 | A1 * | 2/2006 | Fukumizu et al. ........... | 438/706 |

FOREIGN PATENT DOCUMENTS

| | | |
|---|---|---|
| JP | 2002-93778 | 3/2002 |
| JP | 2002-110643 | 4/2002 |
| JP | 2004-71768 | 3/2004 |

* cited by examiner

*Primary Examiner*—Binh X Tran
(74) *Attorney, Agent, or Firm*—Oblon, Spivak, McClelland, Maier & Neustadt, L.L.P.

(57) ABSTRACT

A plasma etching method includes the step of etching a lower organic material film by using an upper organic material film and an intermediate layer as a mask in a processing chamber of a plasma etching apparatus, while using an etching gas made up of a gaseous mixture including an $O_2$ gas and a carbon-containing compound gas which has a carbon atom in a molecule, to thereby transfer a pattern of the intermediate layer to the lower organic material film. A ratio of a flow rate of the carbon-containing compound gas to a total flow rate of the etching gas ranges from about 40 to 99%.

18 Claims, 5 Drawing Sheets

PLASMA ETCHING METHOD

FIELD OF THE INVENTION

The present invention relates to a plasma etching method including a process for etching a target object by using a plasma.

BACKGROUND OF THE INVENTION

The recent trend for achieving an increasingly higher level of integration of semiconductor devices has kept requiring for forming ever finer patterns. To meet such a requirement, when the patterns are formed by employing a dry etching method in a photolithography process, a resist film needs to be very thinly formed on a semiconductor wafer in order to obtain a high resolution for the fine patterns. However, as the thickness of the resist film is kept being reduced to keep up with the fine patterns, a sufficiently high selectivity of a target layer to be etched against the resist film cannot be secured, which in turn makes it difficult to form the fine patterns with a high precision.

As a way to resolve such difficulties, a triple layer resist has been utilized. An example of the triple layer resist is the one having a thick lower resist film made of an organic material, formed on a base layer to be etched for planarization; an intermediate layer made of an inorganic material such as a silicon oxide film, formed on the lower resist film by, e.g., SOG (spin on glass); and an upper resist film (photosensitive resist film) formed on the intermediate layer.

In such a triple layer resist, the upper resist film, which is the uppermost layer, is patterned first by using a photolithography technique, and then the intermediate layer is etched by using the patterned upper resist film as a mask, whereby the pattern of the upper resist film is transferred to the intermediate layer. Thereafter, an etching (dry development) of the lower resist film is carried out by using the upper resist film and the intermediate layer as a mask, so that the pattern of the upper resist film and that of the intermediate layer are transferred to the lower resist film.

Here, the upper resist film formed thinner than the lower resist film disappears in the course of the etching of the lower resist film, so that the etching of the lower resist film is completed by using the intermediate layer as a mask. After the etching, only the patterned lower resist film and intermediate layer are left, and then the base layer is etched by using laminated mask structure including the lower resist film and the intermediate layer.

When performing the dry developing process in such a series of etching processes, that is, to etch the lower resist film by using the upper resist film and the intermediate layer as a mask, an $O_2$ based etching gas has been used (see, for example, Patent References 1 to 3).

[Patent Reference 1]

Japanese Patent Laid-open Application No. 2002-93778 (for example, claim 3)

[Patent Reference 2]

Japanese Patent Laid-open Application No. 2002-110643 (for example, claim 4)

[Patent Reference 3]

Japanese Patent Laid-open Application No. 2004-71768 (for example, claim 1)

When performing the dry developing process by using the $O_2$ based etching gas, it is difficult to etch the lower resist film vertically, thereby resulting in a poor controllability over an etching profile. Further, when performing dry development of a pattern with a wide opening area, residues of reaction products from the etching tend to be attached to thereby be accumulated on the surface of the base layer that should be exposed through the opening after the dry etching development. Moreover, control over the etching profile and suppression of the generation of the etching residues are in a trade-off relation in the dry developing process performed by the plasma of the $O_2$ based etching gas, and no etching condition satisfying these two requirements has been found yet.

SUMMARY OF THE INVENTION

It is, therefore, an object of the present invention to provide a plasma etching method capable of providing a high controllability over an etching profile, while suppressing generation of etching residues, when performing drying development on a lowermost resist film of a triple layer resist by using a plasma of an $O_2$ based gas.

In accordance with a first aspect of the present invention, there is provided a plasma etching method for performing an etching on a target object having a lower organic material film, an intermediate layer formed of an inorganic material and an upper organic material film, which are formed on a base layer in that order, the intermediate layer and the upper organic material film being patterned, the method comprising the step of etching the lower organic material film by using the upper organic material film and the intermediate layer as a mask in a processing chamber of a plasma etching apparatus, while using an etching gas made up of a gaseous mixture including an $O_2$ gas and a carbon-containing compound gas which has a carbon atom in a molecule, to thereby transfer a pattern of the intermediate layer to the lower organic material film, wherein a ratio of a flow rate of the carbon-containing compound gas to a total flow rate of the etching gas ranges from about 40 to 99%.

It is preferable that the carbon-containing compound gas is a CO gas, and a flow rate ratio of a flow rate of the CO gas to the total flow rate of the etching gas ranges from about 50 to 99%.

Further, it is preferable that the carbon-containing compound gas is a $CH_4$ gas, and a ratio of a flow rate of the $CH_4$ gas to the total flow rate of the etching gas ranges from about 40 to 60%.

It is also preferable that the plasma etching apparatus is a capacitively coupled plasma etching apparatus which generates a plasma by producing a high frequency electric field between a pair of an upper and a lower electrode facing each other. In such a case, a high frequency power ranging from about 500 to 1000 W for plasma generation may be applied to the upper electrode, while a high frequency power ranging from about 100 to 300 W for ion attraction may be applied to the lower electrode, and a high frequency power ranging from about 500 to 1000 W for plasma generation and a high frequency power ranging from about 100 to 300 W for ion attraction may be applied to the lower electrode. Further, a high frequency power for plasma generation may be applied to the upper or the lower electrode at a power density ranging from about 0.94 to 1.88 $W/cm^2$.

In accordance with a second aspect of the present invention, there is provided a computer executable control program, which controls, when executed, a plasma processing apparatus to perform the plasma etching method of the first aspect.

In accordance with a third aspect of the present invention, there is provided a computer-readable storage medium for storing therein a computer executable control program, wherein the control program controls, when executed, a plasma processing apparatus to perform the plasma etching method of the first aspect.

In accordance with a fourth aspect of the present invention, there is provided a plasma processing apparatus including a processing chamber for performing a plasma etching on a target object; a support for mounting the target object thereon in the processing chamber; a gas exhaust unit for depressurizing the processing chamber; a gas supply unit for supplying a processing gas into the processing chamber; and a control unit for controlling the plasma etching method of the first aspect to be carried out in the processing chamber.

In accordance with the plasma etching method of the present invention described above, when performing dry development on a lower resist film of a triple layer by using a gaseous mixture including an $O_2$ gas and a carbon-containing compound gas with a specific flow rate ratio, high level of accuracy of etching profiles can be obtained and generation of etching residues on a wide opening pattern can be suppressed.

Accordingly, the plasma etching method in accordance with the present invention has advantages when it is applied to an etching step of a semiconductor manufacturing process involving a miniaturizing work, and the method allows a fabrication of semiconductor devices of a high reliability.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Figure 1:
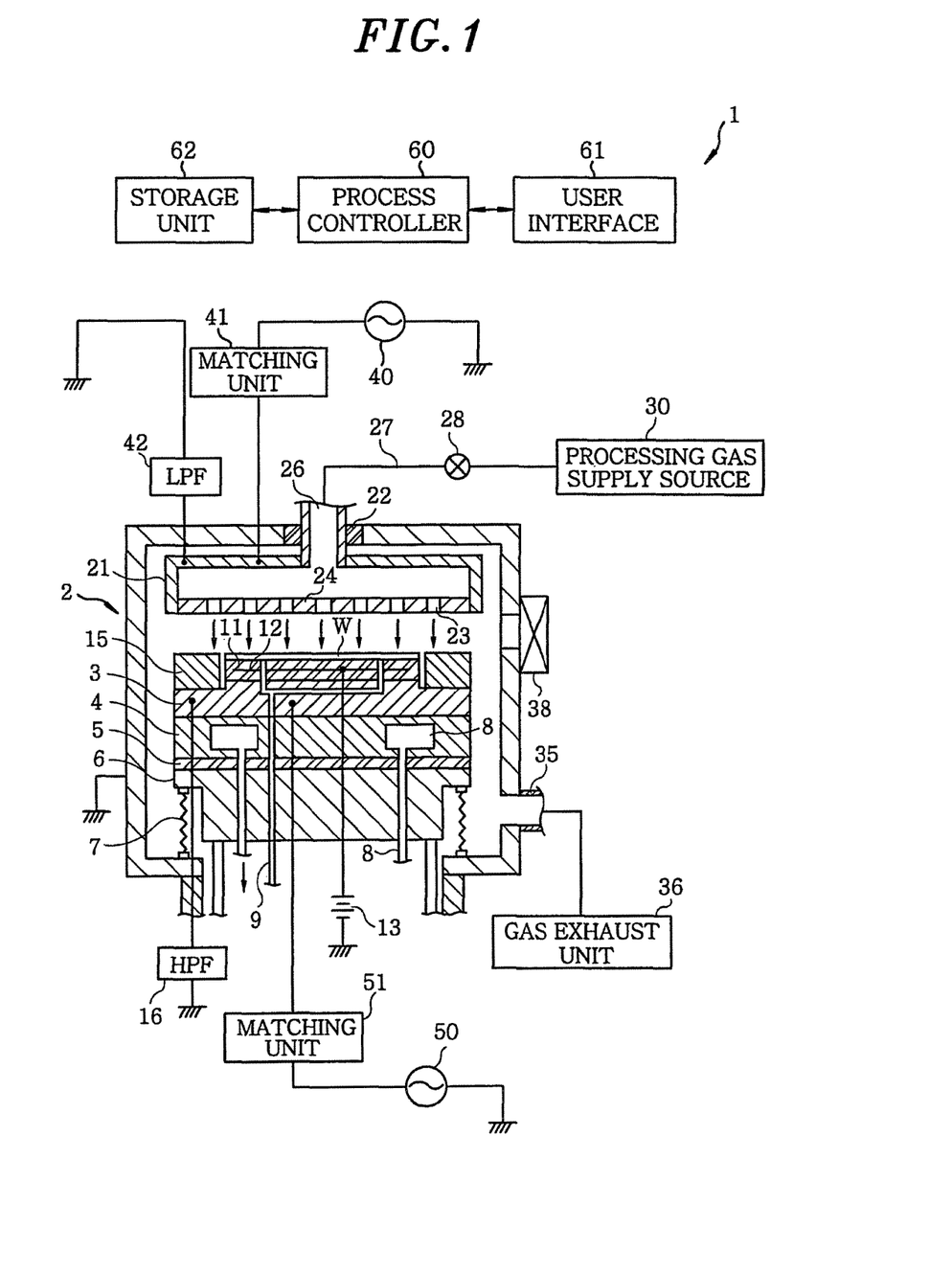
FIG. 1 is a cross sectional view showing a schematic configuration of a plasma etching apparatus adequate for performing a plasma etching method in accordance with an embodiment of the present invention.

Hereinafter, embodiments of the present invention will be described in detail with reference to the accompanying drawings so that they can be readily implemented by those skilled in the art. FIG. 1 shows a schematic configuration of an exemplary plasma etching apparatus adapted for implementing a method of the present invention. The plasma etching apparatus 1 is of a capacitively coupled parallel plate type etching apparatus having an upper and a lower electrode plate placed to face each other in parallel, wherein a high-frequency power supply for plasma generation is connected to either one of the upper and the lower electrode.

The plasma etching apparatus 1 includes a chamber 2 configured as a cylindrical processing vessel made of aluminum whose surface is thermally sprayed with ceramic, wherein the chamber 2 is grounded. Installed in the chamber 2 is a susceptor 3 made of, e.g., silicon, for horizontally mounting thereon a semiconductor wafer W on which a specified film is formed, while also serving as a lower electrode. The susceptor 3 is supported by a support member 4, and the support member 4 is supported on a support 6 of an elevation mechanism not shown via an insulating plate 5 such as ceramic. The susceptor 3 can be moved up and down by the elevation mechanism. The atmospheric portion in a central region beneath the support 6 is covered with a bellows 7 and is isolated from the inside of the chamber 2.

A coolant path 8 is formed inside the support member 4, and a coolant such as Golden is introduced into the coolant path 7 via a coolant introducing line 8a to be circulated therethrough. By the circulation of the coolant, the cold heat of the coolant is transferred to the wafer W via the susceptor 3, whereby the processing surface of the wafer W is maintained at a desired temperature level. Further, in order to cool the wafer W effectively by the coolant circulating through the coolant path 8 even when the chamber 2 is maintained in a vacuum state, a gas channel 9 for supplying a heat transfer medium, e.g., a He gas, to the rear side of the wafer W is provided. Thus, the cold heat of the susceptor 3 is transferred to the wafer W through the heat transfer medium, so that the temperature of the wafer W can be controlled with a high precision.

The susceptor 3 is of a disk shape with a central portion protruded higher than its peripheral portion. Installed on the central uppermost portion of the susceptor 3 is an electrostatic chuck 11 shaped substantially identical to the wafer W. An annular focus ring 15 is disposed on the periphery of the top surface of the susceptor 3 to surround the wafer W loaded on the electrostatic chuck 11. The focus ring 15 serves to improve uniformity of etching.

A shower head 21 serving also as an upper electrode is disposed above the susceptor 3, while facing it in parallel. The shower head 21 is supported at an upper portion of the chamber 2 via an insulating member 22 and is provided with a number of injection openings 23 at its surface 24 facing the susceptor 3. Further, the shower head 21 is separated apart from the surface of the wafer W by a distance ranging from, e.g., about 30 to 90 mm, and this distance is adjustable by means of the elevation mechanism.

Figure 2:
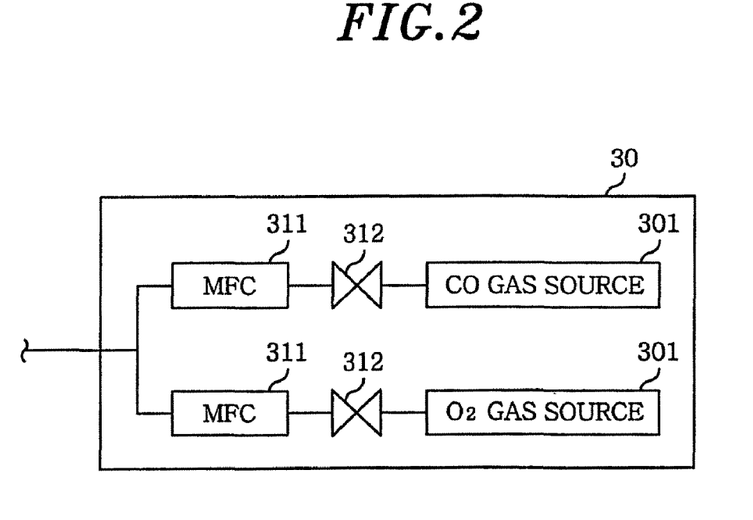
FIG. 2 shows a configuration example of a processing gas supply system.
Figure 3:
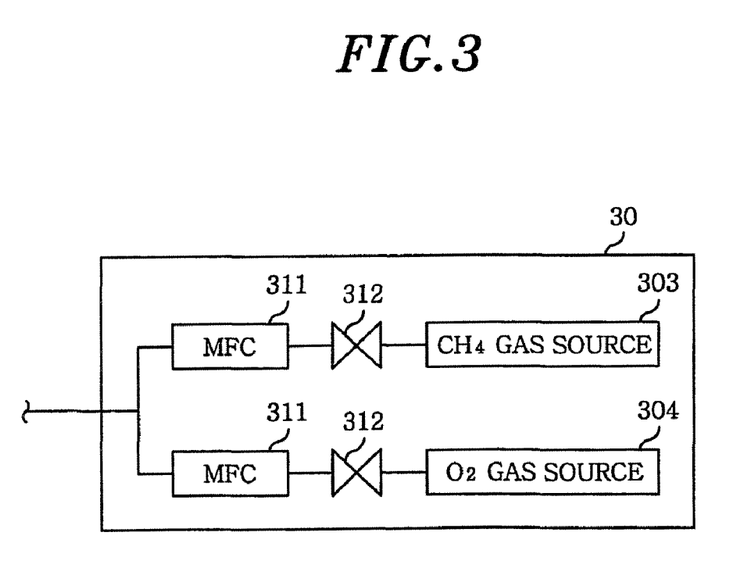
FIG. 3 illustrates another configuration example of the processing gas supply system.

A gas inlet portion 26 is formed at a center of the shower head 21, and a gas supply line 27 is coupled to the gas inlet portion 26. Further, a processing gas supply source 30 for supplying a processing gas is connected to the gas supply line 27 via a valve 28. As illustrated in FIG. 2, the processing gas supply system 30 includes a CO gas source 301 and an $O_2$ gas source 302, and a mass flow controller 311 and a valve 312 are installed on each gas line from these two gas sources. FIG. 3 illustrates another configuration example of the processing gas supply system 30. In this example, the processing gas supply system 30 has a $CH_4$ gas source 303 and an $O_2$ gas source 304, and a mass flow controller 311 and a valve 312 are installed on each gas line from these two gas sources.

As an etching gas, $CO/O_2$ or $CH_4/O_2$ is introduced into the inner space of the shower head 21 via the gas supply line 27 and the gas inlet port 26 from their individual gas sources of the processing gas supply line to be finally discharged through the gas injection openings 23.

Connected to an opening prepared at a sidewall bottom portion of the chamber 2 is a gas exhaust line 35, which is coupled to a gas exhaust unit 36. The gas exhaust unit 36 includes a vacuum pump such as a turbo molecular pump, and serves to depressurize the chamber, i.e., to evacuate the chamber 2 such that the inner pressure thereof is reduced down to a specific vacuum level, e.g., 1 Pa or less. Further, installed on a sidewall of the chamber 2 are a loading/unloading port 37 for the wafer w and a gate valve 38 for opening or closing the loading/unloading port. The wafer W is transferred between the chamber 2 and an adjacent load lock chamber (not shown) while the gate valve 38 is opened.

A high frequency power supply 40 is connected to the shower head 21 via a matching unit 41. The high frequency power supply 40 supplies a high frequency power of a frequency of, e.g., about 60 MHz to the shower head 21, whereby a high frequency electric field for plasma generation is formed between the shower head 21 serving as the upper electrode and the susceptor 3 serving as the lower electrode. Further, a low pass filter (LPF) 42 is connected to the shower head 21.

A high frequency power supply 50 is connected to the susceptor 3 via a matching unit 51. The high frequency power supply 50 supplies a high frequency power of a frequency of, e.g., about 2 MHz to the susceptor 3, whereby ions in the plasma are attracted toward the wafer W, allowing a realization of an etching with high anisotropy. Further, a high pass filter (HPF) 16 is connected to the susceptor 3.

Further, each component of the plasma etching apparatus 1 is connected to and controlled by a process controller 60 with a CPU. The process controller 60 is connected to a user interface 61 including a keyboard with which a process manager executes command input manipulation in order to manage the plasma etching apparatus 1, a display which visualizes and displays an operation status of the plasma etching apparatus 1, and the like.

Moreover, also connected to the process controller 60 is a storage unit 62 for storing therein recipes which record control programs (software), processing condition data and the like to be used in realizing various processes performed in the plasma etching apparatus 1 under the control of the process controller 60.

Further, if necessary, a recipe is retrieved from the storage unit 62 by an instruction from the user interface 61 and executed by the process controller 60, whereby desired processing in the plasma etching apparatus 1 is performed under the control of the processing controller 60. For example, based on the amount of abrasion of the focus ring 15 or the variation of the plasma sheath formed over the focus ring 15 detected by the monitor 50, the process controller 60 decides a DC voltage to be applied to the focus ring 15, as will be described below.

Moreover, it is possible to use the recipes such as the control programs, the processing condition data and the like stored in a computer readable storage medium, e.g., a CD-ROM, a hard disc, a flexible disc, a flash memory or the like, or to use the recipes on-line by transmitting it from other devices, e.g., via a dedicated line whenever necessary.

Figure 4:
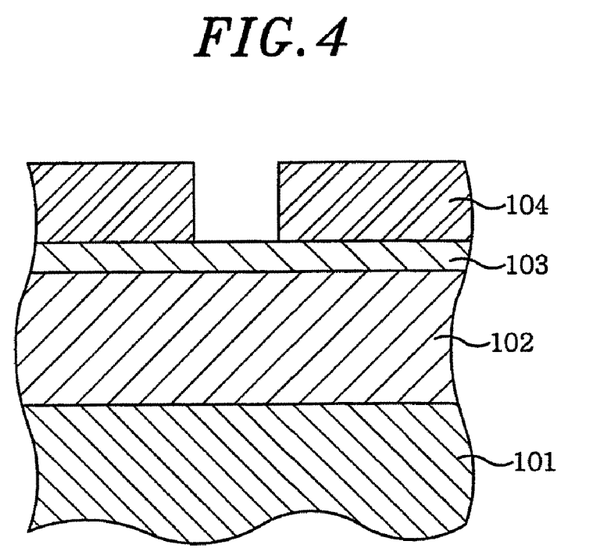
FIG. 4 presents a schematic view showing a surface structure of a semiconductor wafer, especially showing a patterned upper resist film.

A scheme of a dry developing process for a multilayered resist, which is performed by the plasma etching apparatus 1 having the above-described configuration, will be explained with reference to FIGS. 4 to 7. First, as shown in FIG. 4, a lower resist film 102 made of, e.g., an organic material, a SOG film 103 made of an inorganic material such as $SiO_2$ and an upper resist film 104 made of an organic material such as a polymetachrylate based resin are sequentially formed on a base layer 101 serving as a final object to be etched, made up of, e.g., silicon oxide ($SiO_2$). Here, the thickness of the upper resist film 104 is smaller than that of the lower resist film 102. Further, the upper resist film 104 has a pattern formed by a photolithography technique. Moreover, though not shown here, an antireflection film may be formed between the SOG film 103 and the upper resist film 104.

Figure 5:
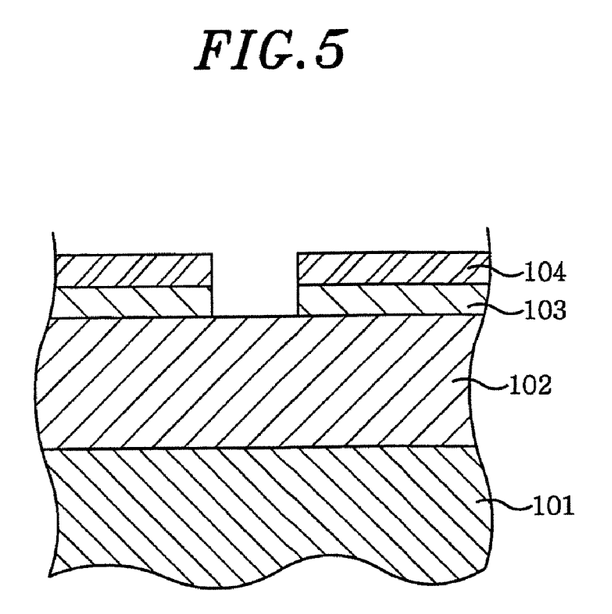
FIG. 5 depicts a schematic view showing a surface structure of the semiconductor wafer, especially showing a state after etching a SOG film.

Then, the SOG film 103 is etched by using an etching gas including a fluorocarbon based gas such as $CF_4$ while using the upper resist film 104 as a mask, whereby the pattern of the upper resist film 104 is transferred to the SOG film 103, as illustrated in FIG. 5.

Thereafter, a dry developing process is performed by etching the lower resist film 102 by using the upper resist film 104 and the SOG film 103 as a mask. Preferably, the above-described capacitively coupled plasma etching apparatus 1 is used for this dry developing process. By introducing an etching gas including a carbon-containing compound gas and an $O_2$ gas into the chamber 2 at a specific gas flow rate ratio, and applying individual high frequency powers to the shower head 21 and the susceptor 3 serving as the upper and the lower electrode, respectively, a high frequency electric field is formed between the upper and the lower electrode. A plasma of the etching gas is excited by the high frequency electric field, and the etching of the lower resist film 102 is performed by the plasma.

The carbon-containing compound gas used in this dry developing process may be, for example, a CO gas, a $CH_4$ gas, a $C_2H_6$ gas, a $C_3H_8$ gas, or the like, and among these, the CO gas and the $CH_4$ gas are particularly preferable. These carbon-containing compound gases are so-called depositive gases, which tend to readily generate reaction products during the etching, so that the generated reaction products would stick to the sidewall of the lower resist film 102 to serve as a protective film, whereby a side etching is suppressed. As a result, generation of undercuts beneath the mask portion would be avoided.

Further, it is also possible, if necessary, to form the sidewall of the lower resist film 102, which would serve as a mask for the etching of the base layer 101, to have a tapered shape for the purpose of narrowing opening widths/opening diameters of trenches or holes formed on the base layer 101 such that they become narrower than those on the upper resist film patterned by employing the photolithography process. Such a good controllability over an etching profile is obtained by selecting the flow rate ratio between the carbon-containing compound gas and the $O_2$ gas within a specific ratio range.

To control the etching profile of the lower resist film 102, a ratio of the flow rate of the carbon-containing compound gas to the total flow rate of the etching gas is preferably set to range from about 40 to 99%. More preferable flow rate ratio of the etching gas is varied depending on the type of the carbon-containing compound gas involved.

For example, when a gaseous mixture of a CO gas and an $O_2$ gas is used as an etching gas, a ratio of a flow rate of the CO gas to a total flow rate of the etching gas is preferably set to range from about 50 to 90%. If the flow rate ratio of the CO gas to the total etching gas is lower than about 50%, a side etching would progress, resulting in a formation of undercuts directly beneath the SOG film 103 serving as an etching mask, whereby a control over the etching profile becomes difficult. Meanwhile, if the flow rate ratio of the CO gas to the total etching gas exceeds about 99%, an etch stop might occur.

Further, when using a gaseous mixture of a $CH_4$ gas and an $O_2$ gas as an etching gas, a ratio of a flow rate of the $CH_4$ gas to a total flow rate of the etching gas is preferably set to range from about 40 to 60%. If the flow rate ratio of the $CH_4$ gas to the total etching gas is lower than about 40%, a side etching would progress, resulting in a formation of undercuts directly beneath the SOG film 103 serving as the etching mask, whereby a control over the etching profile becomes difficult.

Meanwhile, if the flow rate ratio of the $CH_4$ gas to the total etching gas exceeds about 60%, the amount of deposits becomes excessively great, resulting in an occurrence of etch stop and thus making it difficult to control the etching profile. Moreover, when etching a large opening pattern, there occurs a problem that reaction products accumulate as etching residues on the surface of the base layer 101 which should be exposed.

Further, a high frequency power applied to the shower head 21 (upper electrode) to generate the plasma of the etching gas in the chamber 2 is preferably set to range from, for example, about 500 to 1000 W (power density: about 0.94 to 1.88 $W/cm^2$). Here, the power density refers to a value obtained by dividing the high frequency power applied to the upper electrode by a sum of surface areas of the semiconductor wafer W and the focus ring 15 made of a silicon material (this definition is also applied to the following description). In the plasma etching apparatus 1 shown in FIG. 1, the power density was computed by setting the outer diameter of the focus ring 15 as 260 mm and the outer diameter of the wafer W as 200 mm.

If the high frequency power applied to the shower head 21 is less than about 500 W, plasma density decreases, so that there is a concern that the etching rate of the upper resist film 102 made of the organic material would decrease extremely. If this high frequency power exceeds about 1000 W, on the other hand, there occurs a problem that the reaction products would accumulate as etching residues on the surface of the base layer 101 which should be exposed.

A high frequency power applied to the susceptor 3 (lower electrode) is preferably set to range from, for example, about 100 to 300 W. If the high frequency power applied to the susceptor 3 is less than about 100 W, there is a concern that the etching rate would decrease extremely or side etching or etching residues would be caused. If this high frequency power exceeds 300 W, on the other hand, the etching rate would become excessively high, so that precise control would become difficult.

Figure 6:
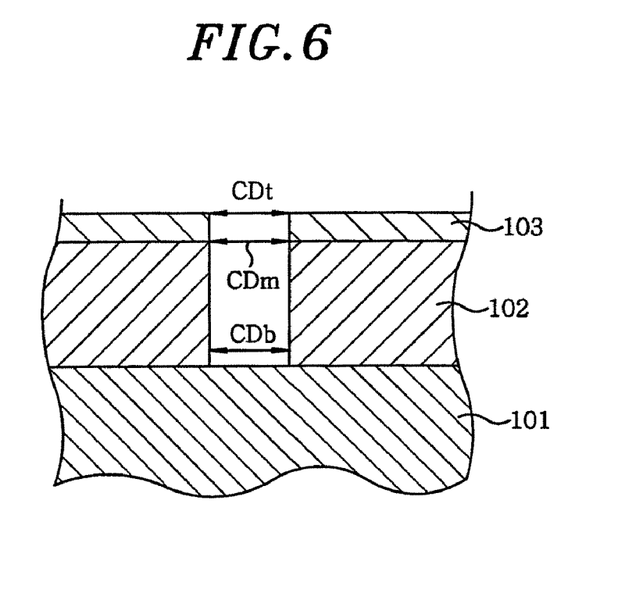
FIG. 6 sets forth a schematic view showing a surface structure of the semiconductor wafer, especially showing a state after dry development.

In the dry developing process for etching the lower resist film 102, since the upper resist film 104 is formed thinner than the lower resist film 102, the upper resist film 104 is all worn away and removed in the course of the etching of the lower resist film 102. Accordingly, when the etching of the lower resist film 102 is being completed, only the SOG film 103 remains to serve (?:"to serve" inserted) as a mask. Through this dry developing process, the pattern of the upper resist film 104 and the SOG films 103 are transferred to the lower resist film 102, so that mask pattern, which is constructed by the laminated lower resist film 102 and SOG film 103, is formed on the base layer 101, as shown in FIG. 6.

Figure 7:
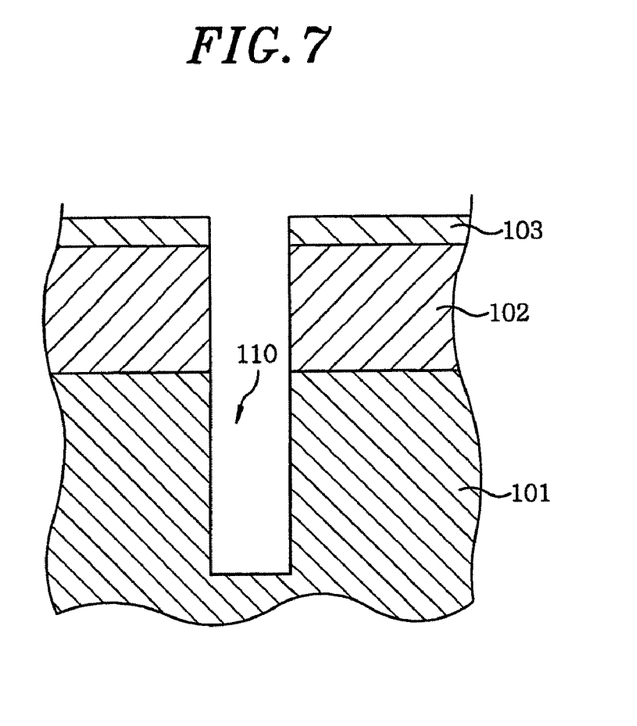
FIG. 7 provides a schematic view showing a surface structure of the semiconductor wafer, especially showing a state after forming a recess by etching.

Then, by etching the base layer 101 through the lower resist film 102 and the SOG film 103 with the specific pattern as a mask, a desired recess 110 such as a trench or a hole can be formed on the base layer 101, as illustrated in FIG. 7.

Now, a process sequence for performing the etching (dry development) on the lower resist film 102 by using the plasma etching apparatus 1 shown in FIG. 1 will be explained in detail. First, the gate valve 38 is opened, and a semiconductor wafer W having a laminated surface structure as shown in FIG. 5 is loaded into the chamber 2 to be finally mounted on the susceptor 3. Then, the gate valve 38 is closed.

Subsequently, the susceptor 3 is moved upward until the distance between the shower head 21 and the surface of the wafer W on the susceptor 3 becomes, for example, ranging from about 50 to 60 mm. Then, the chamber 2 is evacuated by the vacuum pump of the gas exhaust unit 36 via the gas exhaust line 35 to reduce the internal pressure of the chamber 2 to a specific pressure level. Afterward, by applying a DC voltage from the DC power supply 13 to the electrode 12 embedded within the electrostatic chuck 11, the wafer W is attracted to the electrostatic chuck 11 electrostatically to be held thereon.

Thereafter, an etching gas made up of a CO gas/an $O_2$ gas or a $CH_4$ gas/an $O_2$ gas is supplied into the chamber 2 from the processing gas supply system 30. Then, by applying a high frequency power of, e.g., about 60 MHz to the shower head 21 from the high frequency power supply 40, a high frequency electric field is formed between the shower head 21 serving as the upper electrode and the susceptor 3 serving as the lower electrode, whereby the etching gas is converted into plasma.

An etching of the upper resist film 102 is performed by the plasma of the etching gas so generated. At this time, a high frequency power of a specific frequency of, e.g., 2 MHz is applied to the susceptor 3 from the high frequency power supply 50 so as to attract ions in the plasma toward the susceptor 3.

The etching is completed when the pattern of the SOG film 103 is transferred to the lower resist film 102 by etching of the lower resist film 102, as shown in FIG. 6. If necessary, the etching may be performed for a time period needed for performing 10 to 30%, preferably, 15 to 20% of overetching.

Other processing conditions (except the gas flow rate ratio and the high frequency powers) for performing the etching on the lower resist film 102 for the dry development thereof, which is performed by using the plasma etching apparatus 1, will be specified below in the following explanation of experiments conducted to investigate effects of the present invention.

Now, results of the experiments will be described. Each of the following experiments was performed by using a laminated body having a lower resist film 102 made of an organic material and having a thickness of 306 nm; a SOG film 103 made of $SiO_2$ and having a thickness of 106 nm; and an upper resist film 104, which is an ArF resist film, having a thickness of 180 nm which are laminated on a Si substrate used as a base layer 101.

Example 1

By using the plasma etching apparatus of FIG. 1, a plasma etching was performed on a laminated body having the same structure as that shown in FIG. 5, whereby an etching (dry development) of a lower resist film 102 was performed.

The etching was conducted under the following fixed conditions while only varying a flow rate ratio of an etching gas. Further, the etching was performed for a time period needed for performing 20% of overetching.

<Fixed Conditions>
pressure: 1.3 Pa (10 mTorr);
upper electrode RF power (60 MHz)=1000 W (power density: 1.88 $W/cm^2$);
lower electrode RF power (2 MHz)=200 W
backing pressure (center/edge)=1333 Pa/4666 Pa (10/35 Torr; He gas);
distance between the upper and the lower electrode=55 mm;

temperature (upper electrode/chamber sidewall/lower electrode)=60° C./50° C./20° C.

<Flow Rate Ratio of the Etching Gas>

A gaseous mixture of $CO/O_2$ was used as an etching gas at a flow rate ratio of: 80/20 mL/min (sccm), 50/50 mL/min (sccm) or 20/80 mL/min (sccm).

After the etching, etching profiles were observed based on images captured by a transmission electron microscope (TEM). First, critical dimensions of the etching profiles were measured at a central portion (center portion) and a peripheral portion (edge portion) of a wafer W in each of a densely patterned region and a sparsely patterned region, which are formed on the center portion and edge pertion of the wafer by the dry development. Measurement points were three, as shown in FIG. 6; a top CD ($CD_t$), a middle CD ($CD_m$) and a bottom CD ($CD_b$). Based on the measurement results, whether side etching (occurrence of undercuts under mask portions) occurred or not was investigated, and the result is provided in Table 1.

Further, under the above-specified etching conditions, whether etching residues were generated on a wide opening pattern for forming, e.g., a desired pad or guide ring, or not was investigated. The result is provided in Table 2.

TABLE 1

|  | center portion | edge portion |
| --- | --- | --- |
| flow rate ratio of $CO/O_2$ 80/20 [mL/min (sccm)] | densely patterned region 110/114/114 no occurrence of side etching sparsely patterned region 122/122/104 no occurrence of side etching | densely patterned region 118/118/112 no occurrence of side etching sparsely patterned region 118/120/110 no occurrence of side etching |
| flow rate ratio of $CO/O_2$ 50/50 [mL/min (sccm)] | densely patterned region 92/128/116 occurrence of side etching sparsely patterned region 118/136/114 occurrence of side etching | densely patterned region 108/140/116 occurrence of side etching sparsely patterned region 138/168/116 occurrence of side etching |
| flow rate ratio of $CO/O_2$ 20/80 [mL/min (sccm)] | densely patterned region 120/152/120 occurrence of side etching sparsely patterned region 106/126/118 occurrence of side etching | densely patterned region 120/160/122 occurrence of side etching sparsely patterned region 140/180/120 occurrence of side etching |

※ The values represent $CD_t/CD_m/CD_b$ [unit: nm]

TABLE 2

| flow rate ratio of CO/O2 [mL/min (sccm)] | center portion | edge portion |
| --- | --- | --- |
| 80/20 | no residues generated | no residues generated |
| 50/50 | no residues generated | no residues generated |
| 20/80 | no residues generated | no residues generated |

In Table 1, as the flow rate ratio of $CO/O_2$ increases, differences between the $CD_t$, $CD_m$ and $CD_b$ are reduced and an occurrence of side etching is suppressed regardless of an in-surface position on the wafer W and a pattern density, so that a high level of etching accuracy can be obtained. Further, as for the large opening pattern, no etching residue was found thereat under every condition of the example, as revealed from Table 2.

Example 2

By using the plasma etching apparatus of FIG. 1, a plasma etching was performed on a laminated body having the same structure as that shown in FIG. 5, so that an etching (dry development) of a lower resist film 102 was performed. The etching was conducted under the following fixed conditions while only varying high frequency powers applied to the upper and the lower electrode, the etching was performed for a time period needed for performing 20% of overetching.

<Fixed Conditions> flow rate ratio of $CO/O_2$=80/20 mL/min (sccm), 50/50 mL/min (sccm);

pressure: 1.3 Pa (10 mTorr);

backing pressure (center/edge)=1333 Pa/4666 Pa (10/35 Torr; He gas);

distance between the upper and the lower electrode=55 mm;

temperature (upper electrode/chamber sidewall/lower electrode)=60° C./50° C./20° C.

<High Frequency Powers> upper electrode RF power (60 MHz)=500 W (power density: 0.94 W/cm$^2$, 1000 W (power density: 1.88 W/cm$^2$) or 1500 W (power density: 2.83 W/cm$^2$)

lower electrode RF power (2 MHz)=100 W, 200 W or 300 W

By, after etching, measuring $CD_t$, $CD_m$ and $CD_b$ based on images from the TEM, whether the etching residues were generated or not was investigated. The result is provided in Table 3.

Further, in case of forming a wide opening pattern, whether etching residues were generated (on the wide opening) or not was also observed, as in the Example 1. The observation result is provided in Table 4.

TABLE 3

| RF power | center portion 500 W | edge portion 500 W | center portion 1000 W | edge portion 1000 W | center portion 1500 W | edge portion 1500 W |
|---|---|---|---|---|---|---|
| 300 W | | | densely patterned region 114/122/122 no residues generated sparsely patterned region 106/106/96 no residues generated | densely patterned region 104/110/110 no residues generated sparsely patterned region 130/130/114 no residues generated | | |
| 200 W | densely patterned region 120/120/118 no residues generated sparsely patterned region 130/130/112 no residues generated | densely patterned region 134/134/118 no residues generated sparsely patterned region 156/156/122 no residues generated | densely patterned region 110/114/114 no residues generated sparsely patterned region 122/122/104 no residues generated | densely patterned region 118/118/112 no residues generated sparsely patterned region 118/120/110 no residues generated | densely patterned region 106/118/112 residues generated sparsely patterned region 108/108/92 residues generated | densely patterned region 126/126/110 residues generated sparsely patterned region 102/102/90 residues generated |
| 100 W | | | densely patterned region 106/114/114 residues generated sparsely patterned region 142/142/106 residues generated | densely patterned region 120/122/108 residues generated sparsely patterned region 122/122/106 residues generated | | |

※ The values represent $CD_t/CD_m/CD_b$ [unit: nm]

TABLE 4

| RF power | center portion 500 W | edge portion 500 W | center portion 1000 W | edge portion 1000 W | center portion 1500 W | edge portion 1500 W |
|---|---|---|---|---|---|---|
| 300 W | | | no residues generated | no residues generated | | |
| 200 W | no residues generated | no residues generated | no residues generated | no residues generated | residues generated | residues generated |
| 100 W | | | residues generated | residues generated | | |

In Table 3, there is found a tendency that the amount of etching residues increases regardless of an in-surface position on a wafer W and a pattern density when the RF power applied to the upper electrode is 1500 W. Further, etching residues are also generated when the RF power applied to the lower electrode is 100 W. As for the CDs, if the etching gas has an optimum flow rate ratio, a difference between the $CD_m$ and the $CD_b$ is extremely small when the RF power applied to the upper electrode is in a range from 500 to 1500 W (i.e., when power density ranges from 0.94 to 2.83 W/cm²).

Further, from Table 4, it is confirmed that etching residues on the large opening pattern are generated when the RF power applied to the upper electrode is 1500 W and, also, when the RF power applied to the lower electrode is 100 W.

Example 3

By using the plasma etching apparatus shown in FIG. 1, a plasma etching was performed on a laminated body having the same structure as that shown in FIG. 5, whereby an etching (dry development) of a lower resist film 102 was performed. The etching was conducted under the following fixed conditions while only varying a flow rate ratio of an etching gas, and was performed for a time period needed for performing 20% of overetching.

<Fixed Conditions>
pressure: 1.3 Pa (10 mTorr);
upper electrode RF power (60 MHz) 1000 W (1.88 W/cm²);
lower electrode RF power (2 MHz)=200 W;
backing pressure (center/edge)=1333 Pa/4666 Pa (10/35 Torr; He gas);
distance between the upper and the lower electrode=55 mm;
temperature (upper electrode/chamber sidewall/lower electrode)=60° C./50° C./20° C.
<Flow Rate Ratio of the Etching Gas>
A gaseous mixture of $CH_4/O_2$ was employed as an etching gas at a flow rate ratio of: 80/20 mL/min (sccm), 50/50 mL/min (sccm) or 20/80 mL/min (sccm).

After the etching, etching profiles were observed based on images from the TEM. First, critical dimensions of the etching profiles were measured at a central portion (center portion) and a peripheral portion (edge portion) of a wafer W in each of a densely patterned region and a sparsely patterned region, which are formed on the center portion and edge portion of the wafer by the dry development. Measurement points were three, as shown in FIG. 6; a top CD ($CD_t$), a middle CD ($CD_m$) and a bottom CD ($CD_b$). Based on the measurement results, whether side etching (occurrence of undercuts under mask portions) occurred or not was estimated, and the result is provided in Table 5.

Further, under the above-specified etching conditions, whether etching residues were generated on a wide opening pattern for forming, e.g., a desired pad or guide ring, or not was investigated. The result is provided in Table 6.

TABLE 5

|  | center portion | edge portion |
|---|---|---|
| flow rate ratio of $CH_4/O_2$ 80/20 [mL/min (sccm)] | densely patterned region —/—/— etch stop sparsely patterned region —/—/— etch stop | densely patterned region —/—/— etch stop sparsely patterned region —/—/— etch stop |
| flow rate ratio of $CH_4/O_2$ 50/50 [mL/min (sccm)] | densely patterned region 96/110/108 no occurrence of side etching sparsely patterned region 96/104/104 no occurrence of side etching | densely patterned region 104/110/114 no occurrence of side etching sparsely patterned region 104/116/108 no occurrence of side etching |
| flow rate ratio of $CH_4/O_2$ 20/80 [mL/min (sccm)] | densely patterned region 90/124/116 occurrence of side etching sparsely patterned region 118/134/114 occurrence of side etching | densely patterned region 92/122/118 occurrence of side etching sparsely patterned region 102/116/114 occurrence of side etching |

※ The values represent $CD_t/CD_m/CD_b$ [unit: nm]

TABLE 6

| flow rate ratio of $CH_4/O_2$ [mL/min (sccm)] | center portion | edge portion |
|---|---|---|
| 80/20 | no residues generated | no residues generated |
| 50/50 | no residues generated | no residues generated |
| 20/80 | no residues generated | no residues generated |

In Table 5, if the flow rate ratio of the $CH_4/O_2$ is great, generation of deposits is markedly facilitated regardless of an in-surface position on the wafer W and a pattern density, thereby causing an etch stop. In contrast, if the flow rate ratio of the $CH_4/O_2$ is low, side etching occurs, so that accuracy of etching profile is decreased. In case the flow rate ratio of the $CH_4/O_2$ is 50/50 (=1), differences between the $CD_t$, the $CD_m$ and the $CD_b$ are small and side etching is suppressed, so that a high level of etching accuracy can be obtained. Further, as for the large opening pattern, no etching residue was found thereat under every condition of the example, as can be seen from Table 6.

Example 4

By using the plasma etching apparatus of FIG. 1, a plasma etching was performed on a laminated body having the same structure as that shown in FIG. 5, whereby an etching (dry development) of a lower resist film 102 was performed. The etching was performed under the following fixed conditions while only varying high frequency powers applied to the upper and the lower electrode, and was performed for a time period needed for performing 20% of overetching.
  <Fixed Conditions>
  flow rate ratio of $CH_4/O_2$=50/50 mL/min (sccm);
  pressure: 1.3 Pa (10 mTorr);
  backing pressure (center/edge)=1333 Pa/4666 Pa (10/35 Torr; He gas);
  distance between the upper and the lower electrode=55 mm;
  temperature (upper electrode/chamber sidewall/lower electrode)=60° C./50° C./20° C.
  <High Frequency Powers>
  upper electrode RF power (60 MHz)=500 W (power density: 0.94 W/cm$^2$), 1000 W (power density: 1.88 W/cm$^2$ or 1500 W (power density: 2.83 W/cm$^2$);
  lower electrode RF power (2 MHz)=100 W, 200 W or 300 W After the etching, $CD_t$, $CD_m$ and $CD_b$ were measured based on images from the TEM, as in the Example 3, and generation of etching residues was investigated. The result is provided in Table 7.

Further, a presence or absence of etching residues was also observed for a case of forming a wide opening pattern, as in the Example 3, and the result is provided in Table 8.

TABLE 7

| RF power | center portion 500 W | edge portion 500 W | center portion 1000 W | edge portion 1000 W | center portion 1500 W | edge portion 1500 W |
|---|---|---|---|---|---|---|
| 300 W | | | densely patterned region 100/110/112 no residues generated sparsely patterned region 108/110/104 no residues generated | densely patterned region 94/112/114 no residues generated sparsely patterned region 96/112/92 no residues generated | | |
| 200 W | densely patterned region 94/106/106 no residues generated | densely patterned region 98/110/104 no residues generated | densely patterned region 96/110/108 no residues generated | densely patterned region 104/110/114 no residues generated | densely patterned region 102/114/114 residues generated | densely patterned region 102/110/110 residues generated |

TABLE 7-continued

| RF power | center portion 500 W | edge portion 500 W | center portion 1000 W | edge portion 1000 W | center portion 1500 W | edge portion 1500 W |
|---|---|---|---|---|---|---|
| 100 W | sparsely patterned region 114/108/100 no residues generated | sparsely patterned region 98/104/96 no residues generated | sparsely patterned region 96/104/104 no residues generated densely patterned region 110/110/108 residues generated sparsely patterned region 110/116/116 residues generated | sparsely patterned region 104/116/108 no residues generated densely patterned region 94/116/112 residues generated sparsely patterned region 116/122/118 residues generated | sparsely patterned region 102/104/104 residues generated | sparsely patterned region 104/116/104 residues generated |

※ The values represent $CD_t/CD_m/CD_b$ [unit: nm]

TABLE 8

| RF power | center portion 500 W | edge portion 500 W | center portion 1000 W | edge portion 1000 W | center portion 1500 W | edge portion 1500 W |
|---|---|---|---|---|---|---|
| 300 W | | | no residues generated | no residues generated | | |
| 200 W | no residues generated | no residues generated | no residues generated | no residues generated | residues generated | residues generated |
| 100 W | | | residues generated | residues generated | | |

In Table 7, there is found a tendency that etching residues increase regardless of an in-surface position on a wafer W and a pattern density when the RF power applied to the upper electrode is 1500 W. Further, etching residues are also generated when the RF power applied to the lower electrode is 100 W. As for the CDs, if the etching gas has an optimum flow rate ratio, a difference between the $CD_m$ and the $CD_b$ is extremely small when the RF power applied to the upper electrode is in a range from 500 to 1500 W (i.e., when power density ranges from 0.94 to 2.83 W/cm²) Further, from Table 8, it is confirmed that etching residues in the large opening pattern are generated when the RF power to the upper electrode is 1500 W and, also, when the RF power to the lower electrode is 100 W.

Example 5

By using the plasma etching apparatus shown in FIG. 1, a plasma etching was performed on a laminated body having the same structure as that shown in FIG. 5, so that an etching (dry development) of a lower resist film 102 was performed. The etching was conducted under the following fixed conditions while only varying a flow rate ratio of an etching gas, and was performed for a time period needed for performing 20% of overetching.

<Fixed Conditions>
pressure: 1.3 Pa (10 mTorr);
upper electrode RF power (60 MHz)=1000 W (1.88 W/cm²);
lower electrode RF power (2 MHz)=200 W;
backing pressure (center/edge)=1333 Pa/4666 Pa (10/35 Torr; He gas);
distance between the upper and the lower electrode=55 mm;
temperature (upper electrode/chamber sidewall/lower electrode)=60° C./50° C./20° C.

<Flow Rate Ratio of the Etching Gas>

A gaseous mixture of $CH_4/O_2$ was employed as an etching gas at a flow rate ratio of: 80/20 mL/min (sccm), 60/40 mL/min (sccm), 50/50 mL/min (sccm), 40/60 mL/min (sccm) or 20/80 mL/min (sccm).

After the etching, etching profiles were observed based on images from the TEM. In this example, a bottom CD ($CD_b$) was measured at each of a central portion (center portion) and a peripheral portion (edge portion) of a wafer W, and a variation of the $CD_b$ was estimated. The result is provided in FIG. 9. Further, FIG. 8 shows a relationship between the gas flow rate ratio and the $CD_b$.

TABLE 9

| flow rate ratio of $CH_4/O_2$ [mL/min (sccm)] | center portion | edge portion |
|---|---|---|
| 80/20 | etch stop | etch stop |
| 60/40 | 102 | 100 |
| 50/50 | 108 | 114 |
| 40/60 | 116 | 120 |
| 20/80 | 116 (occurrence of side etching) | 118 (occurrence of side etching) |

Figure 8:
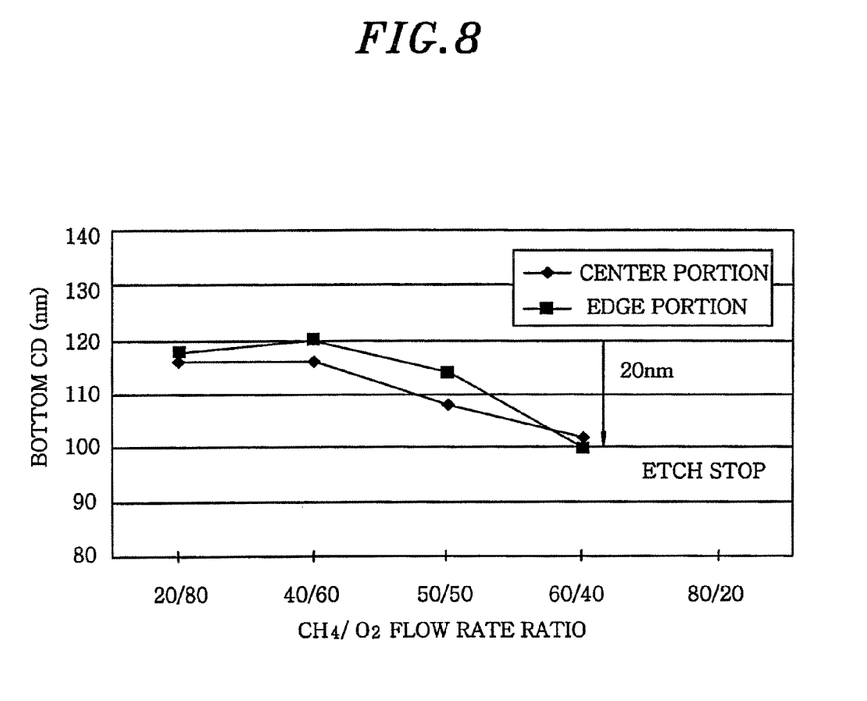
FIG. 8 is a graph showing a relationship between a flow rate ratio of $CH_4/O_2$ and a bottom CD.

From Table 9 and FIG. 8, it is confirmed that the $CD_b$ can be controlled by varying the flow rate ratio of the $CH_4/O_2$ gas. In particular, in comparison of the $CH_4/O_2$ flow rate ratios of 40/60 mL/min (sccm) and 60/40 mL/min (sccm), the $CD_b$ at the flow rate ratio of 60/40 mL/min was smaller than the $CD_b$ at the flow rate ratio of 40/60 mL/min by 20 nm at maximum. It is deemed that in case of the etching with the $CH_4/O_2$ flow rate ratio of 60/40 mL/min (sccm), reducing the $CD_b$ results from a formation of a tapered sidewall of the lower resist film 102 after the etching As such, by varying the flow rate ratio of the $CH_4/O_2$ within the range from 40/60 to 60/40 mL/min (sccm), it is possible to control the opening width/opening diameter of the lower resist film 102, which is to be used as a mask for the etching of the base layer 101.

Accordingly, the opening width/opening diameter of that mask (lower resist film 102) for forming a recess 110 on the base layer 101 can be controlled to be smaller than the opening width/opening diameter of the upper resist film 104 whose pattern is formed by, e.g., photolithography. Moreover, as shown in Table 9, a side etching occurred when the $CH_4/O_2$ flow rate ratio was 20/80 mL/min (sccm). Further, when the $CH_4/O_2$ flow rate ratio was 80/20 mL/min (sccm), an etch stop occurred due to an increase of deposits.

In accordance with the plasma etching method of the present invention as described above, by controlling a flow rate ratio of a carbon-containing compound gas and high frequency powers applied to the upper and the lower electrode, the accuracy of etching profiles can be improved, while it is also possible to suppress generation of etching residues. Accordingly, the plasma etching method in accordance with the present invention has advantages when it is applied to an etching step of a semiconductor manufacturing process involving a miniaturizing work, and the method allows a fabrication of semiconductor devices of a high reliability.

Here, it is to be noted that the present invention is not limited to the embodiment as described above, but it can be modified in various ways. For example, though the embodiment has been described for the case of using the parallel plate type plasma etching apparatus for performing an etching by applying high frequency power to the upper and the lower electrode, an etching apparatus of a type that applies a high frequency power to either one of an upper and a lower electrode can be employed instead.

In such a case, the etching apparatus may have a mechanism of applying, e.g., a high frequency power for plasma generation and a high frequency power for ion attraction to the lower electrode. Further, a magnetron RIE plasma etching apparatus using permanent magnets can also be employed instead. Moreover, the etching apparatus is not limited to the capacitively coupled plasma etching apparatus but various other types of plasma etching apparatuses, e.g., an inductively coupled plasma etching apparatus can be employed.

The present invention has advantages when it is applied to a manufacturing process of various semiconductor devices such as dynamic random access memories (DRAM).

While the invention has been shown and described with respect to the embodiments, it will be understood by those skilled in the art that various changes and modifications may be made without departing from the spirit and scope of the invention as defined in the following claims.

What is claimed is:

1. A plasma etching method for performing an etching on a target object having a lower organic material film, an intermediate layer formed of an inorganic material and an upper organic material film, which are formed on a base layer in that order, the intermediate layer and the upper organic material film being patterned, the method comprising the steps of:
   etching the lower organic material film by using the upper organic material film and the intermediate layer as a mask in a processing chamber of a plasma etching apparatus, while using an etching gas made up of a gaseous mixture including an $O_2$ gas and a CO gas, to thereby transfer a pattern of the intermediate layer to the lower organic material film, wherein a ratio of a flow rate of the CO gas to a total flow rate of the etching gas ranges from about 40 to 99%; and
   etching the base layer including $SiO_2$ by using the lower organic material film and the intermediate layer as a mask.

2. The plasma etching method of claim 1, wherein a ratio of a flow rate of the CO gas to the total flow rate of the etching gas ranges from about 50 to 99%.

3. The plasma etching method of claim 1, wherein the gaseous mixture is composed of the $O_2$ gas and the CO gas.

4. The plasma etching method of claim 1, wherein before starting the etching step, the thickness of the upper organic material film is less than that of the lower organic material film, and
   wherein all the upper organic material film is removed during the etching step.

5. The plasma etching method of claim 1, further comprising, prior to the step of etching the lower organic material film, the step of etching the intermediate layer by using the upper organic material film as a mask while using an etching gas including a fluorocarbon based gas.

6. The plasma etching method of claim 1, wherein the plasma etching apparatus is a capacitively coupled plasma etching apparatus which generates a plasma by producing a high frequency electric field between a pair of an upper and a lower electrode facing each other.

7. The plasma etching method of claim 6, wherein a high frequency power ranging from about 500 to 1000 W for plasma generation is applied to the upper electrode, while a high frequency power raging from about 100 to 300 W for ion attraction is applied to the lower electrode.

8. The plasma etching method of claim 6, wherein a high frequency power ranging from about 500 to 1000 W for plasma generation and a high frequency power ranging from about 100 to 300 W for ion attraction are applied to the lower electrode.

9. The plasma etching method of claim 6, wherein a high frequency power for plasma generation is applied to the upper or the lower electrode at a power density ranging from about 0.94 to 1.88 $W/cm^2$.

10. A plasma etching method for performing an etching on a target object having a lower organic material film, an intermediate layer formed of an inorganic material and an upper organic material film, which are formed on a base layer in that order, the intermediate layer and the upper organic material film being patterned, the method comprising the steps of:
    etching the lower organic material film by using the upper organic material film and the intermediate layer as a mask in a processing chamber of a plasma etching apparatus, while using an etching gas made up of a gaseous mixture, to thereby transfer a pattern of the intermediate layer to the lower organic material film, wherein the gaseous mixture includes an $O_2$ gas and a $CH_4$ gas, and a ratio of a flow rate of the $CH_4$ gas to a total flow rate of the etching gas ranges from about 40 to 99%; and
    etching the base layer including $SiO_2$ by using the lower organic material film and the intermediate layer as a mask.

11. The plasma etching method of claim 10, wherein a ratio of a flow rate of the $CH_4$ gas to the total flow rate of the etching gas ranges from about 40 to 60%.

12. The plasma etching method of claim 10, wherein the gaseous mixture is composed of the $O_2$ gas and the $CH_4$ gas.

13. The plasma etching method of claim 10, wherein before starting the etching step, the thickness of the upper organic material film is less than that of the lower organic material film, and
    wherein all the upper organic material film is removed during the etching step.

14. The plasma etching method of claim 10, further comprising, prior to the step of etching the lower organic material film, the step of etching the intermediate layer by using the upper organic material film as a mask while using an etching gas including a fluorocarbon based gas.

15. The plasma etching method of claim 10, wherein the plasma etching apparatus is a capacitively coupled plasma etching apparatus which generates a plasma by producing a high frequency electric field between a pair of an upper and a lower electrode facing each other.

16. The plasma etching method of claim 15, wherein a high frequency power ranging from about 500 to 1000 W for plasma generation is applied to the upper electrode, while a high frequency power raging from about 100 to 300 W for ion attraction is applied to the lower electrode.

17. The plasma etching method of claim 15, wherein a high frequency power ranging from about 500 to 1000 W for plasma generation and a high frequency power ranging from about 100 to 300 W for ion attraction are applied to the lower electrode.

18. The plasma etching method of claim 15, wherein a high frequency power for plasma generation is applied to the upper or the lower electrode at a power density ranging from about 0.94 to 1.88 W/cm$^2$.

* * * * *